Jan. 7, 1964 B. M. SOSIN 3,117,285

VERY HIGH FREQUENCY AMPLIFIER ARRANGEMENTS

Filed May 26, 1960

INVENTOR

Boleslaw Marian Sosin

BY Baldwin & Wight

ATTORNEYS

United States Patent Office 3,117,285

Patented Jan. 7, 1964

3,117,285

VERY HIGH FREQUENCY AMPLIFIER ARRANGEMENTS

Boleslaw Marian Sosin, Great Baddow, England, assignor to The Marconi Company, Limited, a British company Filed May 26, 1960, Ser. No. 32,038
Claims priority, application Great Britain Oct. 15, 1959
4 Claims. (Cl. 330—53)

Figure 1:
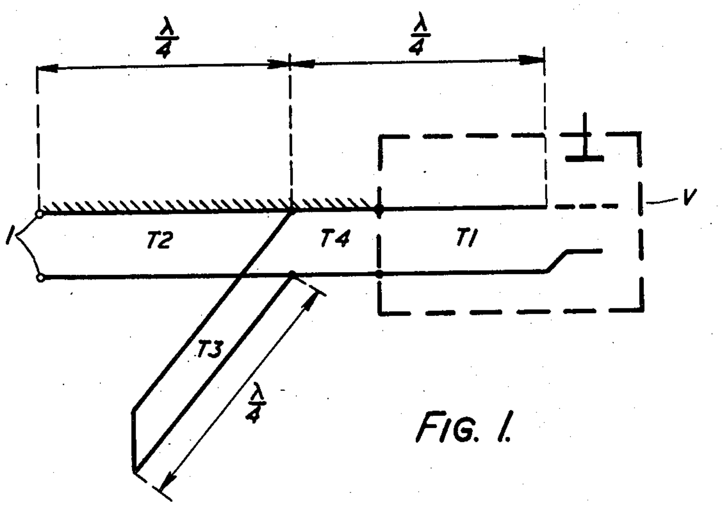

This invention relates to very high frequency (V.H.F.) amplifier arrangements and more particularly, although not exclusively, to such arrangements for use in television.

Valves used in V.H.F. amplifiers commonly have grid and cathode leads which are a substantial fraction of a wavelength long at the frequencies in use and commonly approach a quarter of a wavelength long. Known amplifiers for use in television and incorporating such valves usually employ more or less complex matching arrangements to tune out the effects of the grid and cathode leads in order to obtain the bandwidth required for television signals. Such matching arrangements suffer from the defect, in addition to their complexity, that they are difficult to adjust for satisfactory operation. Furthermore it is a common requirement of amplifiers for use in television that the input circuits of the valves thereof should present very low impedance (at the valves to which they are connected) at the second harmonic of their operating frequency so that the valves will operate efficiently. The meeting of this requirement further complicates the matching arrangements of amplifiers as at present known.

The main object of the present invention is to provide V.H.F. amplifier arrangements which will be free of the above mentioned defects, will be simple to construct and operate and will be capable of operation over a much wider frequency band than comparable amplifiers as at present known.

This invention uses valves of the kind in which the grid and cathode leads are a substantial fraction of a wavelength long at the operating frequencies and relies on the fact that the grid and cathode leads thereof are usually substantially equivalent at the fundamental operating frequency, during operation of the valve, to a length of transmission line of substantially uniform characteristic impedance terminated by a resistance of higher value than said characteristic impedance.

According to this invention a very high frequency amplifier has an input arrangement comprising first and second transmission lines, each of length substantially an odd number (including unity) of quarter wavelengths at the mid-band operating frequency, in direct series between the signal input electrodes of a valve of the kind referred to and the signal input terminals, said first line, which is the one nearer the valve, being comprised at least in part by the input electrode leads of said valve; and a third transmission line of length substantially an odd number (including unity) of quarter wavelengths at the mid-band operating frequency short circuited at one end and connected at the other to the points of junction of the aforesaid first and second lines, the characteristic impedances of said second and third lines being such that in operation the impedance presented at said signal input terminals is substantially purely resistive over a wide frequency band.

Preferably each of said lines is a quarter of a wavelength long.

Preferably, each of said transmission lines consists of two parallel conductors and the second line conductor which is connected through a first line conductor to the valve grid, toegther with any part of said first line conductor which may be external to the valve, is constituted by an earth plane.

A difficulty commonly encountered in the use of thermionic valves in V.H.F. amplifiers is that V.H.F. currents tend to be induced in the cathode heater leads and special precautions normally have to be taken to prevent this. In arrangements in accordance with the present invention the common junction of said transmission lines is a point of relatively low impedance at the fundamental and second harmonic frequencies and this fact may be made use of to prevent such induction into the cathode heater leads where the valve in question is of the directly heated type.

Preferably, therefore, where said valve is of the directly heated type, one conductor of said first transmission line is constituted by the valve grid lead (together with an extension thereof if required), and the other conductor of such line is constituted by the two heater leads (together with extensions thereof if required), connected in parallel through D.C.-blocking condensers at the common junction of the transmission lines.

Such an arrangement allows heater current to be fed to said heater leads without requiring special precautions to prevent the induction of V.H.F. currents therein.

Figure 2:
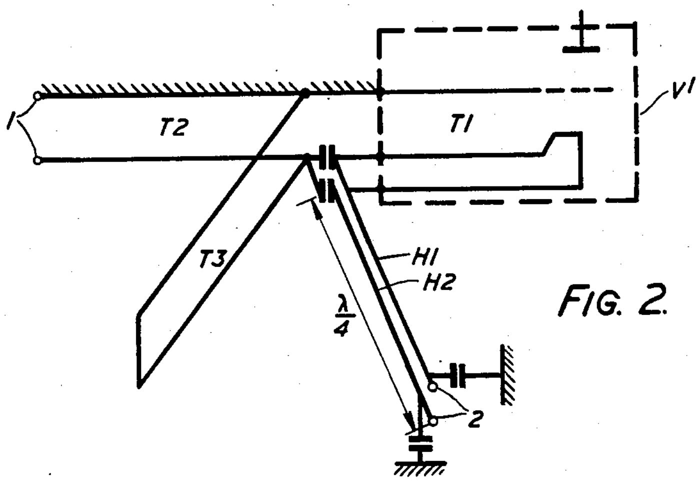

The invention is illustrated in the accompanying drawings in which FIG. 1 is a diagrammatic representation of one embodiment of the invention and FIG. 2 is a similar representation of a preferred embodiment. In the figures like parts are denoted by like references.

Referring to FIG. 1 V represents the envelope of a valve the lengths of whose grid and cathode leads are substantial fractions of a quarter of wavelength at the frequency at which the valve is to be operated, the grid and cathode leads being effectively equivalent in operation at the fundamental operating frequency to a length of transmission line of characteristic impedance $ZO_1$ terminated by a resistive load of greater value than $ZO_1$. The transmission line formed by the grid and cathode leads of the valve V is extended by the transmission line section $T_4$ made up of a conductor and an earth plane in spaced parallel relation thereto, and is also of characteristic impedance $ZO_1$ to form a quarter wave transmission line $T_1$. Between the end of $T_1$ and the input terminals 1 is connected a further quarter wave transmission line $T_2$, also comprising a conductor and an earth plane in spaced parallel relation thereto. The line $T_2$ is of impedance $ZO_2$. At the common junction of $T_1$ and $T_2$ is connected a still further quarter wave transmission line $T_3$, constituted by parallel spaced conductors, and of characteristic impedance $ZO_3$. The line $T_3$ has its ends remote from the common junction of the lines short circuited.

It will be seen that, ignoring the presence of $T_3$, the reactance presented across the terminals 1 due to the valve V and transmission lines $T_1$ and $T_2$ will vary approximately linearly with frequency over a substantial range of frequency, the value thereof passing through zero at the frequency at which $T_1$ and $T_2$ are each a quarter of a wavelength long, and changing sign at that frequency. Likewise, ignoring the presence of $T_1$ and the valve V, the reactance at terminals 1 due to $T_2$ and $T_3$ will vary approximately linearly with frequency about the frequency at which $T_2$ and $T_3$ are each a quarter of a wavelength long but in this case the variation of reactance with frequency will be of opposite sense. Hence, in accordance with well-known transmission line theory which needs no exposition here, the values of $ZO_2$ and $ZO_3$ are so chosen that the variation of reactance with frequency in each of the cases stated above is such that the two variations will cancel and the impedance presented at terminals 1 will be substantially resistive over a wide frequency band. Furthermore the values of $ZO_2$ and $ZO_3$ are so chosen that not only is the impedance presented at terminals 1 substantially resistive but is of a desired predetermined value.

It will be seen that with such an arrangement, due to the short circuit at the end of transmission line $T_3$, a low impedance is presented between the grid and cathode of the valve V at the second harmonic of the operating frequency.

The arrangement of FIG. 2 is similar in many respects to that of FIG. 1 the differences between the two being that the valve $V^1$ in FIG. 2 is indirectly heated and that the two cathode heater leads, in the arrangement of FIG. 2, together with extensions thereof, form one conductor of the complete transmission line $T_1$. The cathode heater leads and their extensions are insulated from one another along their lengths and are joined together through D.C. blocking condensers C at the common junction of $T_1$, $T_2$ and $T_3$, D.C. heater current being fed to the leads adjacent the condensers C. The D.C. heater current is fed from a source (not shown) connected at terminals 2, over the wires $H_1$ and $H_2$ and decoupling condensers are provided as shown. Preferably the wires $H_1$ and $H_2$ are approximately each an odd quarter of a wavelength long (as illustrated they are one quarter of a wavelength in length) but this length is not critical, provided that even quarter wavelengths are avoided. Furthermore, the spacing between the wires $H_1$ and $H_2$ is also not critical.

As the common junction of the transmission lines $T_1$, $T_2$ and $T_3$ is a low impedance point this arrangement does not require the usual special arrangements to prevent the pick-up on the heater leads of V.H.F. currents.

In one experimentally tested embodiment of the invention employing a valve known in the United Kingdom under the trade designation BR1106 and having grid and cathode leads together effectively forming, in operation, a transmission line of characteristic impedance 22.5Ω terminated by a resistance of 63Ω, the values of $ZO_2$ and $ZO_3$ were made equal to 20Ω and 2Ω respectively, each of the transmission lines $T_1$, $T_2$ and $T_3$ being a quarter wavelength long. This arrangement was found to have an effective operating band of from 170 mc./s. to 220 mc./s. and to present at the terminals 1 an impedance of 50Ω.

I claim:

1. Avery high frequency amplifier comprising a vacuum tube having its control grid at grounded potential, a first transmission line, said line being composed at least in part by the input electrode leads of said tube, a second transmission line, said line being in series with said first line and further from said tube, signal input terminals at the end of the second line remote from said tube and a third transmission line, said third line being connected at one end to the points of junction of said first and second lines and being short-circuited at the other, each of said lines being of length substantially an odd number of quarter wavelengths at the mid band operating frequency, the characteristic impedances of said second and third lines being such that in operation the impedance presented at said signal input terminals is substantially purely resistive over a wide frequency band.

2. An amplifier as claimed in claim 1, wherein each of said lines is of length equal to a quarter of a wavelength.

3. An amplifier as claimed in claim 1, wherein each of said transmission lines comprises two parallel conductors, a ground plane, said plane constituting one container of said second transmission line and being connected to the control grid of said tube through any part of one conductor of said first transmission line which may be external to the tube.

4. A very high frequency amplifier comprising an electron tube, having an anode, a cathode and a control grid, a pair of input terminals, a first and second transmission line connected in series between said input terminals and the control grid and cathode of said tube, and a third transmission line having one end connected to the junction points of said first and second transmission lines and the other end short circuited, said first transmission line being comprised, at least in part, by the input leads to said grid and cathode, each of said lines being substantially an odd number of quarter wave lengths at the mid-band operating frequency wherein the impedance presented at said input terminals is substantially purely resistive over a wide frequency band.

References Cited in the file of this patent

UNITED STATES PATENTS

| | | |
|---|---|---|
| 2,408,355 | Turner | Sept. 24, 1946 |
| 2,735,941 | Peck | Feb. 21, 1956 |
| 2,743,422 | Muchmore | Apr. 24, 1956 |
| 2,917,711 | Griffith | Dec. 15, 1959 |
| 2,925,477 | Scharla-Nielsen et al. | Feb. 16, 1960 |